(12) United States Patent
Canda et al.

(10) Patent No.: US 7,078,904 B2
(45) Date of Patent: Jul. 18, 2006

(54) DISTORTION-CORRECTED MAGNETIC RESONANCE MEASUREMENT AND MAGNETIC RESONANCE DEVICE

(75) Inventors: Valer Canda, Erlangen (DE); Robert Krieg, Nuremberg (DE); Oliver Schreck, Bamberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/917,453

(22) Filed: Aug. 13, 2004

(65) Prior Publication Data
US 2005/0035763 A1 Feb. 17, 2005

(30) Foreign Application Priority Data
Aug. 13, 2003 (DE) ................. 103 37 241

(51) Int. Cl.
*G01V 3/00* (2006.01)
(52) U.S. Cl. ...................... 324/319; 324/318
(58) Field of Classification Search ............... 324/319, 324/318, 322, 313, 309, 307, 300
See application file for complete search history.

(56) References Cited

U.S. PATENT DOCUMENTS

| 4,665,368 | A | * | 5/1987 | Sugiyama et al. ......... 324/318 |
| 5,214,383 | A | * | 5/1993 | Perlmutter et al. ......... 324/313 |
| 5,278,503 | A | * | 1/1994 | Keller et al. ............... 324/318 |
| 6,252,405 | B1 | * | 6/2001 | Watkins et al. ............ 324/319 |
| 6,731,113 | B1 | * | 5/2004 | Ham et al. .................. 324/313 |
| 6,844,732 | B1 | * | 1/2005 | Carlini et al. .............. 324/318 |

FOREIGN PATENT DOCUMENTS

| DE | 195 11 791 C1 | 8/1996 |
| DE | 198 29 850 C2 | 1/2001 |
| DE | 100 28 560 C2 | 10/2002 |

* cited by examiner

*Primary Examiner*—Brij B. Shrivastav
(74) *Attorney, Agent, or Firm*—Harness, Dickey & Pierce, P.L.C.

(57) ABSTRACT

A distortion-corrected magnetic resonance examination with a magnetic resonance device is undertaken by use of a distortion correction algorithm which uses coefficients to describe a magnetic field used in a measurement. In this case, after an examination area has been selected, by including the distortion correction algorithm and the coefficients for description of the magnetic field, a measurement area needed for correction is determined. Subsequently a magnetic resonance measurement is performed in the measurement area. Subsequently a distortion-corrected magnetic resonance image of the examination area is created with the aid of the distortion correction algorithm. In addition to the examination area, the measurement area and also any necessary measurement times can be shown on a display of the magnetic resonance device. This type of magnetic resonance examination does not include in the magnetic resonance image any picture elements which were not measured because of distortion.

28 Claims, 3 Drawing Sheets

DISTORTION-CORRECTED MAGNETIC RESONANCE MEASUREMENT AND MAGNETIC RESONANCE DEVICE

The present application hereby claims priority under 35 U.S.C. §119 on German patent application number DE 103 37 241.5 filed Aug. 13, 2003, the entire contents of which are hereby incorporated herein by reference.

FIELD OF THE INVENTION

The invention generally relates to a method for executing a distortion-corrected magnetic resonance examination on a magnetic resonance device. Preferably, it relates to a method that does this by way of a distortion correction algorithm which uses coefficients to describe a magnetic field used in the measurement.

The invention also generally relates to a magnetic resonance device for executing the method.

BACKGROUND OF THE INVENTION

Magnetic resonance technology is a known technology for obtaining images of the inside of the body of an object under examination. It does this by radiating high-frequency signals from a high-frequency system into the object to be investigated such that magnetic resonance signals are emitted by the object under examination. To create a magnetic resonance image from the magnetic resonance signals, location-encoded generation of the magnetic resonance signals is necessary.

Thus, the magnetic resonance signal contains information about the location at which it was created in the object under examination. Location encoding is undertaken using gradient fields which are created by a gradient system and overlaid onto a static basic magnetic field which is created by a basic field magnet system.

A requirement for a unique assignment of the magnetic resonance signals to the corresponding pixels is high homogeneity of the basic and gradient magnetic field. If there are inhomogeneities of the magnetic field present within the imaging volume of the magnetic resonance device, these lead to geometrical distortions of the magnetic resonance image.

Distortion-free and positionally-accurate imaging is important for many applications, for example for the use of magnetic resonance images for planning radiotherapy of tumors or for preparing for or carrying out an operative intervention.

What is referred to as an active shim device is known as a measure for improving the basic magnetic field homogeneity. This employs shim pulses which, for corresponding operation with direct currents, homogenize the basic magnetic field. As known in this connection for example from DE 195 11 791 C1, the basic magnetic field can be described within the imaging volume with coefficients of a series expansion of spherical functions. As a rule the shim coils are designed in this case so that they essentially compensate for a specific inhomogeneous field component corresponding to one of the coefficients. No corresponding correction measure is used for the gradient fields.

For correction of distortions DE 198 29 850 C2 for example proposes a method for construction of a planar cross-sectional image of an object under examination from magnetic resonance signals in inhomogeneous magnetic fields. In this case a magnetic resonance device features a known inhomogeneous main magnetic field and if so, a known non-linear gradient magnetic field.

In a first step of the method original picture elements are created by way of multilayer excitation. In this case the original picture elements originate from magnetic resonance signals created by original volume elements. The original volume elements are arranged in a number of adjacent bended layers arranged behind one another in the object under examination.

In a second step the spatial position of the original picture elements is determined and in a third step picture elements of a planar cross-sectional image are created. The picture elements are representative of volume elements of a planar layer lying within the bended layer. They are created from the original picture elements which are arranged in an environment of the relevant picture element (3D reconstruction).

DE 100 28 560 C2 describes a method for 3D correction with coefficients which are known precisely from development. In this case coefficients of a series expansion of spherical functions of a basic and/or gradient magnetic field are used, in which case the coefficients have been determined as part of a development procedure for a basic magnet system and/or gradient system which create the magnetic fields.

With the method of distortion correction described the problem arises whereby, for correction of the picture elements which lie at the edge of the examination area it is often not possible to perform a complete correction since the image information required for correction lies outside the examination area recorded. Accordingly there is no signal intensity after correction in this type of picture element and the picture element appears black in the magnetic resonance image.

SUMMARY OF THE INVENTION

An object of an embodiment of the invention is to specify a method for performing a distortion-corrected magnetic resonance examination and/or a magnetic resonance device for executing the method. Preferably, the distortion-corrected magnetic resonance image, where possible, does not exhibit any picture elements which cannot be corrected with the aid of a distortion correction algorithm.

An object may be achieved in accordance with an embodiment of the invention by a method for performing a distortion-corrected magnetic resonance examination with a magnetic resonance device by use of a distortion correction algorithm which uses coefficients to describe a magnetic field used in the measurement. An examination area is first selected, then, by including the distortion correction algorithm and the coefficients to describe the magnetic field, a measurement area needed for correction is determined. A magnetic resonance measurement is subsequently performed in the measurement area and finally a distortion-corrected magnetic resonance image of the examination area is created. In this case the magnetic resonance examination can include a single-layer or multilayer image of the examination area.

The advantage of the method is that, depending on the distortion correction algorithm used and the coefficients used to describe the magnetic field, the magnetic resonance measurement can be performed in each case in one measurement area, where the measurement area always allows an optimum correction of the examination area. In this way optimum distortion-corrected magnetic resonance images can be created. A requirement for this is that, because the coefficients and the correction algorithm are known, it is possible even before the measurement of the examination area to make a statement about the overall measurement area required for complete correction. Thus additionally needed areas can be measured as well and the user obtains after measurement an optimally corrected magnetic resonance image of the examination area which does not exhibit any black image areas as a result of correction.

The measurement area depends on the position and size of the examination area, since for example the distortions in the edge area of the magnetic field are stronger than those at the isocenter of the magnetic field. Furthermore the measurement area depends on the picture elements, i.e. on the thickness of the desired layer and on the pixel spacing. Furthermore the static non-linearity of the gradient system used and the gradient strength applied in the measurement in overlaying with the basic magnetic field influence the measurement area. Preferably inhomogeneities of the basic magnetic field are corrected to such an extent beforehand that they can be ignored in the method.

With the aid of the coefficients to describe a magnetic field used in the measurement the distortion of the gradient field in the maximum usable examination area can be calculated. The distortion correction algorithm translates the distortion of the magnetic field, mostly the gradient field, into an assignment between a picture element and one or more measurement picture elements. A picture element here is taken to mean the picture element of a measured layer, in which case the layer does not have to be planar.

Without shift correction the picture elements are also mostly represented as a planar layer image. A measurement picture element here is taken to mean a measured volume element which lies in the usable examination area and from which the magnetic resonance signal originates which belongs to the corresponding picture element. If a true planar image is now to be measured it is necessary to measure all measurement picture elements in order to construct the planar image.

With the aid of the assignment the necessary measurement area can be calculated beforehand during layer planning in the examination area and displayed to the user. With the aid of the method the user can measure fully distortion-corrected images without missing information in the edge areas.

In a further development of the method the distortion-corrected magnetic resonance image is presented on a display device of the magnetic resonance device. In addition to the examination area usually displayed and the layers to be recorded the measurement area is also shown. The measurement area features a correction area in addition to the examination area. It is needed in particular for correcting edge areas of the examination area. Showing the measurement area has the advantage that the operator is automatically informed about the effects of the correction method on a magnetic resonance measurement.

In a particular embodiment of the method an assignment plan is created and stored for the maximum usable examination area which for all the possible picture elements lying in the examination area contains the assignment to the corresponding measurement picture elements. The assignment plan can be created with the aid of the correction algorithm and the coefficients for describing the magnetic field and can be retrieved from a memory at any time.

In an especially fast embodiment of the method, the measurement area is determined by way of the assignment of the correction algorithm starting from picture elements on a surrounding edge of the examination area. This has the advantage that the large number of picture elements of which lie within the examination area and thus need no additional measurement picture elements are not included for determining the measurement area. Accordingly the measurement area is calculated much more quickly. Accordingly a new calculation can be performed for each measurement and the assignment plan does not have to be created beforehand for the entire examination area.

In an embodiment which is particularly informative for the operator the measurement time of the distortion-corrected magnetic resonance examination is displayed compared to the measurement time without distortion correction on the operating interface of the magnetic resonance device. This has the advantage that the operator is informed about the effects of the method on the measurement.

In a further development of the method the operator has the opportunity of activating or deactivating a distortion correction in accordance with an embodiment of the invention in the magnetic resonance device. This last feature has the advantage that the operator, if he does not need the additional information obtained by distortion correction, can switch this feature off and thus obtain magnetic resonance images more quickly.

The second object is achieved by a magnetic resonance device for performing the method which features a basic field magnetic system to create a basic magnetic field, a gradient system to create gradient fields, a control system to store coefficients and an operator interface to display measurement information.

BRIEF DESCRIPTION OF THE DRAWINGS

Further advantages, features and details of the invention will become evident from the description of illustrated exemplary embodiments given hereinbelow and the accompanying drawings, which are given by way of illustration only and thus are not limitative of the present invention, wherein.

DETAILED DESCRIPTION OF THE PREFERRED EMBODIMENTS OF THE INVENTION

Figure 1:
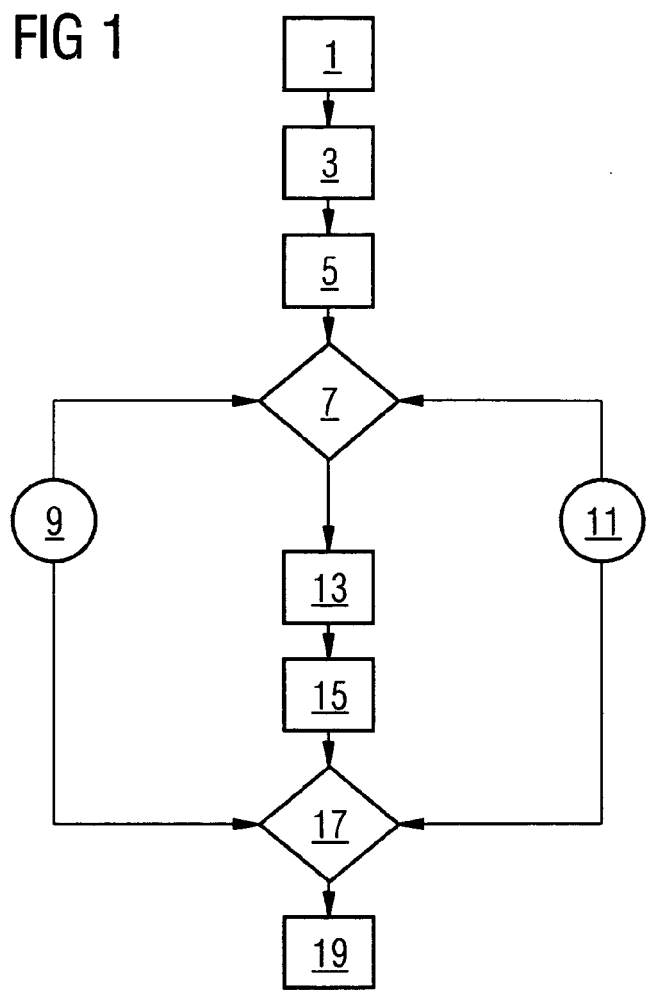
FIG. 1 a typical flow diagram to illustrate the method for performing a distortion-corrected magnetic resonance examination, FIG. 2 a typical flow diagram to illustrate determination of the measurement volume, FIG. 3 a schematicized magnetic resonance device for performing the method, FIG. 4 a typical representation of examination and measurement area for measuring a multi-layer magnetic resonance image and FIG. 5 a typical representation of the examination area, measurement area and critical area for measuring a two-dimensional single-layer magnetic resonance image.

FIG. 1 shows a typical execution sequence of the method in accordance with an embodiment of the invention for performing a distortion-corrected magnetic resonance examination. After a patient is registered, positioned and brought into 1 a magnetic resonance device a localizer measurement 3 is normally performed. The localizer measurement 3 gives the operator an overview of the position of the patient within the magnetic resonance device, in which case the localizer measurement is normally taken at low resolution. The examination area is determined 5 on the basis of the localizer measurement 3. The area of examination is the area of interest which is needed to resolve a clinical inquiry.

The next stage is the calculation 7 of the measurement volume. Input parameters are the examination area, the distortion correction algorithm used 9 and also the coefficients used 11 to describe the magnetic field used in the measurement. For example a distortion field of the magnetic field, mostly of the gradient field, can be calculated with the coefficient 11 and the distortion correction algorithm 9.

The distortion field specifies an assignment plan of which picture elements in the examination area are able to be created by which measurement picture elements in the recording area of the magnetic resonance device. A procedure for creating this type of distortion field for 3D distortion correction is for example described in the publication quoted at the beginning of this document, DE 198 29 850 C2, the entire contents of which are hereby incorporated herein by reference.

In general the measurement area is greater than the desired examination area since, as a result of inhomogeneities of the magnetic field, the measured picture elements do not correspond to a planar magnetic resonance image. Instead the magnetic resonance image is deformed in three dimensions.

In order to be able to create a planar single-layer magnetic resonance image or a number of planar multi-layer magnetic resonance images lying in parallel to one another, the picture elements needed must be combined from various measured measurement picture elements, with a weighting in some cases. How this combination is produced is for example recorded in the distortion field. Despite its size it can be advantageous to calculate the distortion field once and store it so that the information is rapidly available when the magnetic resonance examination is performed.

Alternatively a new individual distortion field can be computed each time from the examination area encountered. Under some circumstances the calculation can be speeded up by only creating the distortion field for an edge area. The distortion field for the entire examination space is memory intensive, recalculating the distortion field each time is computing power intensive.

As soon as the measurement area is determined, a displaying 13 of the area on a display of the magnetic resonance device takes place. It can for example be displayed in addition to the examination area. Furthermore the critical volume can for example be indicated in the examination area. Critical volume here is taken to mean the volume which—if no distortion correction were performed—would be inadequately measured and presented. Furthermore the measurement time needed can be displayed for example. On the basis of such additional information an operator can decide whether he wishes to perform a distortion-corrected magnetic resonance examination. If he does, the magnetic resonance measurement 15 is subsequently undertaken in the measurement area.

Then a distortion correction 17 of the magnetic resonance measurement is performed with the aid of the distortion correction algorithm 9, the coefficients 11 or the calculated distortion field. Finally the distortion-corrected magnetic resonance images are displayed 19.

Performing a distortion-corrected measurement leads to a lengthening of the measurement time. The operator must also weigh image quality against measurement time. Using a suitable user prompt at the operator interface the operator can be informed of this situation and help can be given to him in searching for the optimum magnetic resonance examination, i.e. for the compromise between measurement time and image quality.

The following embodiments are conceivable: In a first version the operator, as shown in FIG. 1, can be informed visually. I.e. a further area, the measurement area, is drawn in in layer-separation mode around the desired examination area that he has drawn. This can be done for example by dashed lines or shaded areas.

In another version the necessary measurement area is calculated in the background, i.e. the algorithm automatically calculates the measurement area needed and integrates this into the magnetic resonance examination. The operator only knows that this is being done because the automatic distortion correction is switched on and he does not get any black areas of the image.

In a further version the operator can choose whether to have additional layers beyond the examination area in which he is interested measured or not. However the magnetic resonance device automatically sets all the relevant parameters without the layers being explicitly displayed. The advantage of this is that the operator is not confused by this type of additional technical information.

In a further version the operator can specify a maximum extension of the measurement time and the magnetic resonance device calculates the correspondingly optimized magnetic resonance measurement which in its turn defines a measurement area, with the aid of which the examination area can be distortion-corrected in the optimum way for the maximum allowed measurement duration.

Figure 2:
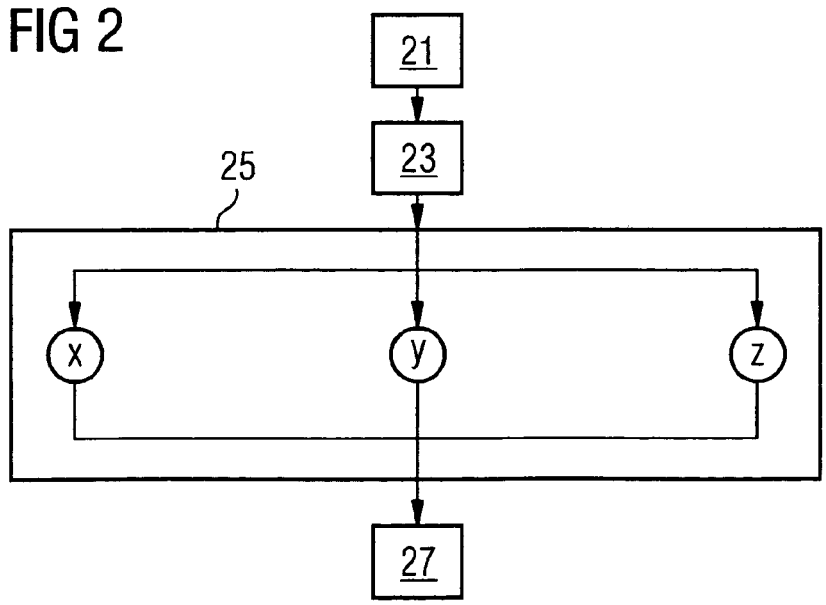

FIG. 2 shows a typical flow diagram to illustrate determining the measurement area. In a first step the gradient magnetic field and basic magnet used are read out 21. Subsequently the coordinates of the area enclosing the examination area are determined 23. For example the image pixels which lie at the outside edge of the examination area 23 are determined.

For each picture element an analysis 25 is undertaken with the aid of the distortion field. For example the contribution of measurement picture elements which lie outside the examination area to the picture elements of the surrounding edge can be defined in the three dimensions X, Y and Z. The maximum measurement area 27 needed is determined with the aid of analysis 25.

The examination area with a correction area is then produced as an extension of the measurement area of the magnetic resonance measurement for example. To allow easy-to-implement gradient magnetic fields the correction area is where possible arranged symmetrically around the examination area. If for example a corner picture element in each dimension requires three further measurement picture elements, the examination area is expanded in all three dimensions by three measurement picture elements.

Figure 3:
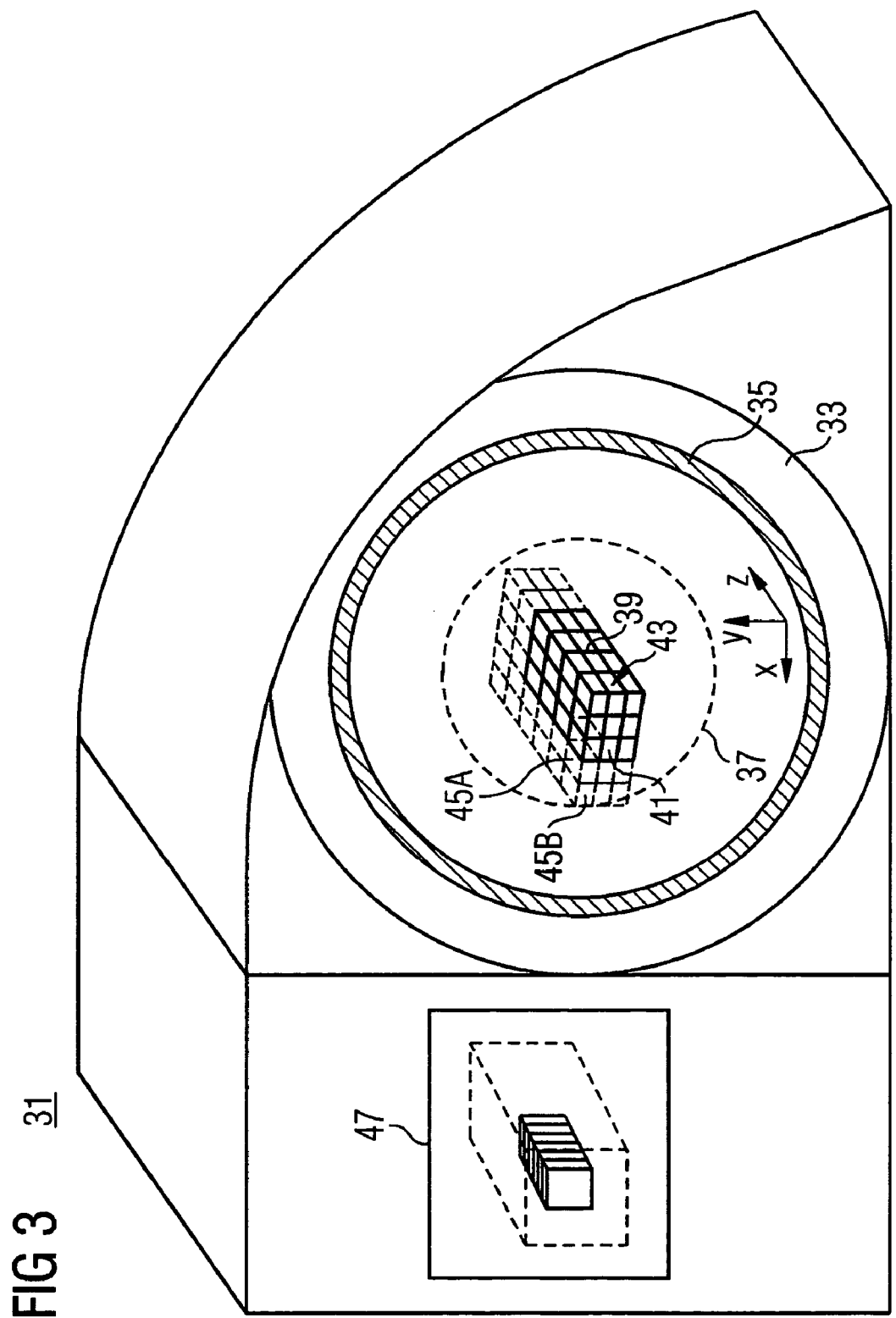

FIG. 3 shows a schematic sketch of a magnetic resonance device 31 for executing a method in accordance with the invention. The magnetic resonance device 31 features a basic field magnet 33 and a gradient coil system 35. In the useful area 37, i.e. in the maximum usable examination area the homogeneity of the basic magnetic field is optimized. For a magnetic resonance examination the basic magnetic field is overlaid with non-linear gradient fields.

The non-linear gradient fields lead to distortions of the magnetic field in the examination area. Accordingly a differentiation between the picture element and the measurement picture element is produced. The operator aims to produce planar single-layer or multi-layer magnetic resonance images. Because of the inhomogeneities however distortions are produced in three dimensions. The picture elements of a non-distortion-corrected measurement thus do not form a planar cross-section.

FIG. 3 shows a selected cuboid-shaped examination area 39. It features 3×3×4 picture elements. To enable the corner picture element 41 of the frontmost layer 43 to be shown, measurement picture elements 45A, 45B are also needed. Accordingly, for distortion-corrected measurement, the measurement area is expanded by an additional two pixels in each dimension around the examination area 39.

Figure 4:
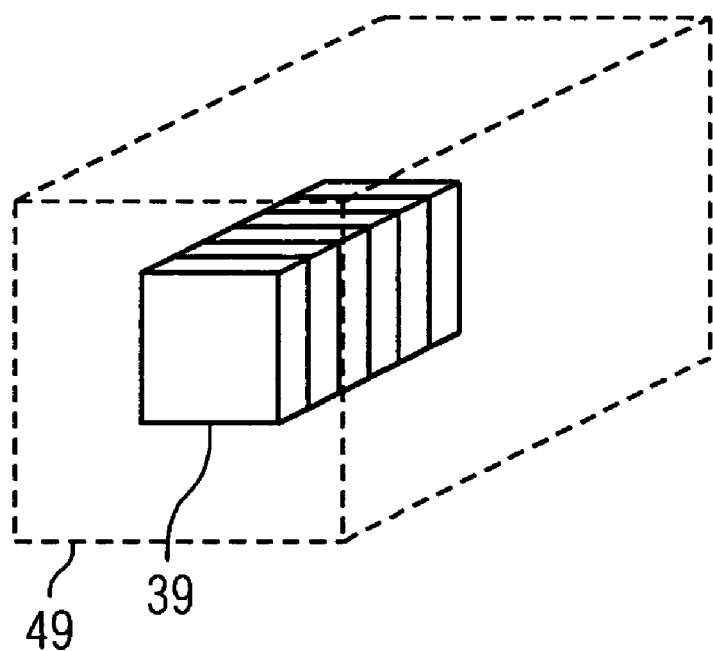

On the display 47 the measurement area is shown schematically as a dashed area around the examination area 39'. FIG. 4 shows an enlarged diagram of a possible presentation on the display 47, in which the examination area 39 is surrounded by a measurement area 49.

Figure 5:
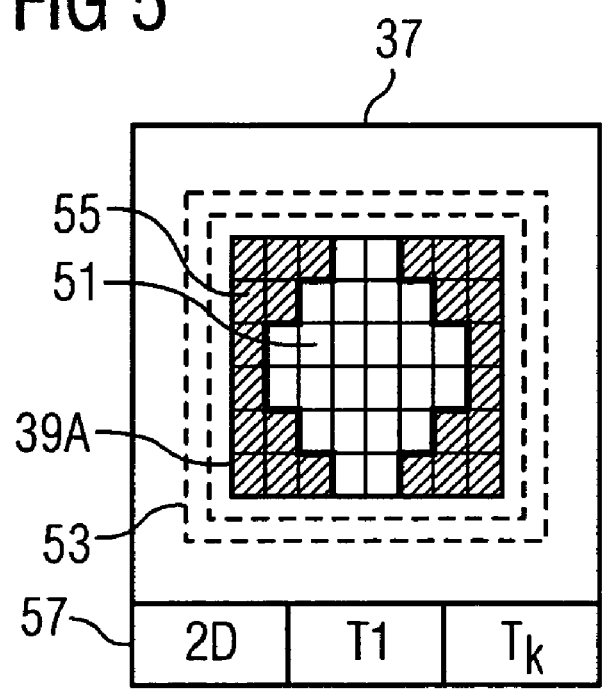

FIG. 5 shows a typical display for planning a two-dimensional magnetic resonance image on the display 47 of the magnetic resonance device 31. The maximum useful area 37 can be seen in cross section, in which a selected examination area 39A lies. With the aid of the distortion field, those edge pixels are shown shaded which would not be optimally displayed without correction because of distortions of the magnetic field. Only the central area 51 can be shown as an undistorted planar image without distortion correction.

In addition the diagram shows two rows of measurement picture elements 53 around the examination area 39A which also allow distortion-corrected measurement of the marked edge picture elements 55.

Furthermore the display text field 57 specifies the type of presentation (2D for single-layer measurement) as well as the measurement times of the uncorrected measurement T and the corrected measurement $T_K$.

Any of the aforementioned methods may be embodied in the form of a program. The program may be stored on a computer readable media and is adapted to perform any one of the aforementioned methods when run on a computer. Thus, the storage medium or computer readable medium, is adapted to store information and is adapted to interact with a data processing facility or computer to perform the method of any of the above mentioned embodiments.

The storage medium may be a built-in medium installed inside a computer main body or removable medium arranged so that it can be separated from the computer main body. Examples of the built-in medium include, but are not limited to, rewriteable involatile memories, such as ROMs and flash memories, and hard disks. Examples of the removable medium include, but are not limited to, optical storage media such as CD-ROMs and DVDs; magneto-optical storage media, such as MOs; magnetism storage media, such as floppy disks (trademark), cassette tapes, and removable hard disks; media with a built-in rewriteable involatile memory, such as memory cards; and media with a built-in ROM, such as ROM cassettes.

Exemplary embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for performing distortion-corrected magnetic resonance examination with a magnetic resonance device by use of a distortion correction algorithm which uses coefficients to describe a magnetic field used in the measurement, the method comprising:

selecting an examination area; determining a measurement area for correction, taking into account the coefficients used to describe the magnetic field and the distortion correction algorithm; executing a magnetic resonance measurement in the measurement area during a measurement process; and creating a distortion-corrected magnetic resonance image of the examination area.

2. Method in accordance with claim 1, wherein the distortion-corrected magnetic resonance image is displayed on a display unit of the magnetic resonance device.

3. Method in accordance with claim 2, wherein the measurement area, in addition to the examination area, also includes a correction area.

4. Method in accordance with claim 1, wherein the measurement area, in addition to the examination area, also includes a correction area.

5. Method in accordance with claim 4, wherein the correction area is used for correction of edge areas of the examination area.

6. Method in accordance with claim 1, wherein, in addition to the selected examination area, the measurement area is displayed at an operator interface of the magnetic resonance device.

7. Method in accordance with claim 6, wherein, for the maximum usable examination area, an assignment plan is created and stored which, for all possible picture elements lying in the examination area, contains the assignment to the corresponding measurement picture elements.

8. Method in accordance with claim 7, wherein, by assignment of the distortion correction algorithm starting from the examination area, especially of picture elements on an edge surrounding the examination area, the measurement area is determined.

9. Method in accordance with claim 7, wherein the distortion correction algorithm creates the picture elements from combinations of weighted measurement picture elements.

10. Method in accordance with claim 1, wherein the distortion correction algorithm determines an assignment of measurement picture elements, which lie in the measurement area of the magnetic resonance measurement, to picture elements of the magnetic resonance image.

11. Method in accordance with claim 10, wherein, by assignment of the distortion correction algorithm starting from the examination area, especially of picture elements on an edge surrounding the examination area, the measurement area is determined.

12. Method in accordance with claim 11, wherein the distortion correction algorithm creates the picture elements from combinations of weighted measurement picture elements.

13. Method in accordance with claim 10, wherein the distortion correction algorithm creates the picture elements from combinations of weighted measurement picture elements.

14. Method in accordance with claim 1, wherein the coefficients are determined within at least one of the framework of a development and manufacturing process for a system creating the magnetic field.

15. Method in accordance with claim 1, wherein at least one of the measurement time of the distortion-corrected magnetic resonance examination and the measurement time extension resulting from distortion correction is displayed at the operator interface of the magnetic resonance device.

16. Method in accordance with claim 1, wherein the execution of a distortion-corrected magnetic resonance examination in the magnetic resonance device is activatable and deactivatable.

17. Method in accordance with claim 1, wherein the magnetic resonance examination includes at least one of a single-layer and multilayer image of the examination area.

18. Magnetic resonance device for executing the method in accordance with claim 1, comprising a basic field magnet system to create a basic magnetic field, a gradient system to create gradient fields, a control system for storing coefficients and an operator interface for displaying measurement information.

19. A magnetic resonance device for performing the method of claim 1.

20. A program, adapted to perform the method of claim 1, when executed on a computer.

21. A computer readable medium, storing the program of claim 20.

22. A method for creating a distortion-corrected magnetic resonance image, the method comprising:

selecting an examination area; determining a measurement area for correction, including a distortion correction algorithm which uses coefficients to describe a magnetic field used in the measurement; executing a magnetic resonance measurement in the determined measurement area during a measurement process; and creating a distortion-corrected magnetic resonance image of the examination area based upon the executed measurement.

23. A magnetic resonance device for performing the method of claim 22.

24. A program, adapted to perform the method of claim 22, when executed on a computer.

25. A computer readable medium, storing the program of claim 24.

26. An apparatus for creating a distortion-corrected magnetic resonance image, comprising:

means for selecting an examination area; means for determining a measurement area for correction, including a distortion correction algorithm which uses coefficients to describe a magnetic field used in the measurement; means for executing a magnetic resonance measurement in the determined measurement area during a measurement process; and means for creating a distortion-corrected magnetic resonance image of the examination area based upon the executed measurement.

27. The apparatus of claim 26, comprising a magnetic resonance device.

28. A magnetic resonance device for performing the method of claim 26.

* * * * *